United States Patent
Lu et al.

(10) Patent No.: US 10,229,977 B2
(45) Date of Patent: Mar. 12, 2019

(54) NITROGEN-CONTAINING SEMICONDUCTOR DEVICE

(71) Applicant: Genesis Photonics Inc., Tainan (TW)

(72) Inventors: Cheng-Hsueh Lu, Tainan (TW); Hsin-Chiao Fang, Tainan (TW); Chi-Hao Cheng, Tainan (TW); Chih-Feng Lu, Tainan (TW); Chi-Feng Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/708,156

(22) Filed: Sep. 19, 2017

(65) Prior Publication Data

US 2018/0083108 A1 Mar. 22, 2018

(30) Foreign Application Priority Data

Sep. 19, 2016 (TW) .............................. 105130176 A

(51) Int. Cl.
*H01L 29/205* (2006.01)
*H01L 33/04* (2010.01)
*H01L 33/32* (2010.01)

(52) U.S. Cl.
CPC ............ *H01L 29/205* (2013.01); *H01L 33/04* (2013.01); *H01L 33/32* (2013.01)

(58) Field of Classification Search
CPC ........ H01L 29/205; H01L 33/04; H01L 33/32
See application file for complete search history.

(56) References Cited

U.S. PATENT DOCUMENTS

| 5,606,185 A | 2/1997 | Nguyen et al. |
| 5,874,747 A | 2/1999 | Redwing et al. |

(Continued)

FOREIGN PATENT DOCUMENTS

| CN | 1431722 | 7/2003 |
| CN | 1505843 | 6/2004 |

(Continued)

OTHER PUBLICATIONS

"Office Action of China Related Application No. 201310028721.9", dated Mar. 15, 2016, p. 1-p. 7.

(Continued)

*Primary Examiner* — Jarrett J Stark
(74) *Attorney, Agent, or Firm* — JCIPRNET

(57) ABSTRACT

A nitrogen-containing semiconductor device including a substrate, a first AlGaN buffer layer, a second AlGaN buffer layer and a semiconductor stacking layer is provided. The first AlGaN buffer layer is disposed on the substrate, and the second AlGaN buffer layer is disposed on the first AlGaN buffer layer. A chemical formula of the first AlGaN buffer layer is $Al_xGa_{1-x}N$, wherein $0 \leq x \leq 1$. The first AlGaN buffer layer is doped with at least one of oxygen having a concentration greater than $5 \times 10^{17}$ cm$^{-3}$ and carbon having a concentration greater than $5 \times 10^{17}$ cm$^{-3}$. A chemical formula of the second AlGaN buffer layer is $Al_yGa_{1-y}N$, wherein $0 \leq y \leq 1$. The semiconductor stacking layer is disposed on the second AlGaN buffer layer.

10 Claims, 2 Drawing Sheets

(56) References Cited

U.S. PATENT DOCUMENTS

| | | | |
|---|---|---|---|
| 6,459,100 | B1 | 10/2002 | Doverspike et al. |
| 6,610,551 | B1 | 8/2003 | Doverspike et al. |
| 6,956,250 | B2 | 10/2005 | Borges et al. |
| 7,030,428 | B2 | 4/2006 | Saxler |
| 7,943,406 | B2 | 5/2011 | Slater, Jr. et al. |
| 7,994,539 | B2 | 8/2011 | Nam |
| 9,117,743 | B2* | 8/2015 | Komiyama ......... H01L 29/2003 |
| 9,859,462 | B2 | 1/2018 | Huang et al. |
| 2003/0020061 | A1 | 1/2003 | Emerson et al. |
| 2005/0029533 | A1 | 2/2005 | Wu et al. |
| 2005/0152420 | A1 | 7/2005 | Kim |
| 2006/0102926 | A1* | 5/2006 | Kikkawa ............ H01L 21/0237 |
| | | | 257/103 |
| 2008/0149918 | A1 | 6/2008 | Yoo et al. |
| 2009/0224226 | A1 | 9/2009 | Huang et al. |
| 2010/0327298 | A1 | 12/2010 | Konno et al. |
| 2011/0056429 | A1 | 3/2011 | Raring et al. |
| 2011/0140083 | A1 | 6/2011 | Driscoll et al. |
| 2011/0140118 | A1 | 6/2011 | Ramdani |
| 2011/0140173 | A1 | 6/2011 | Ramdani |
| 2012/0074385 | A1 | 3/2012 | Tak et al. |
| 2012/0138945 | A1 | 6/2012 | Chen et al. |
| 2012/0217531 | A1* | 8/2012 | Katsuno ................ H01L 33/40 |
| | | | 257/99 |
| 2012/0320642 | A1* | 12/2012 | Imanishi ........... H01L 29/66462 |
| | | | 363/37 |
| 2013/0069033 | A1* | 3/2013 | Kushibe ................ H01L 33/06 |
| | | | 257/13 |
| 2013/0200495 | A1 | 8/2013 | Keller et al. |
| 2013/0329760 | A1 | 12/2013 | Bhat et al. |
| 2014/0045284 | A1 | 2/2014 | Tak et al. |
| 2014/0097443 | A1 | 4/2014 | Fang et al. |
| 2014/0158984 | A1 | 6/2014 | Huang et al. |
| 2015/0048396 | A1 | 2/2015 | Wu et al. |
| 2015/0380605 | A1 | 12/2015 | Cheng et al. |
| 2016/0072009 | A1 | 3/2016 | Huang et al. |
| 2016/0072010 | A1 | 3/2016 | Huang et al. |
| 2018/0090642 | A1* | 3/2018 | Michiue ................ H01L 33/32 |

FOREIGN PATENT DOCUMENTS

| | | |
|---|---|---|
| CN | 1641900 | 7/2005 |
| CN | 101267008 | 9/2008 |
| CN | 101527341 | 9/2009 |
| CN | 101626058 | 1/2010 |
| CN | 101685844 | 3/2010 |
| CN | 101740691 | 6/2010 |
| CN | 102136536 | 7/2011 |
| CN | 102754184 | 10/2012 |
| CN | 102893419 | 1/2013 |
| CN | 103022290 | 4/2013 |
| CN | 103178175 | 6/2013 |
| EP | 2498293 A1 | 9/2012 |
| JP | H02177577 | 7/1990 |
| JP | 2009026865 | 2/2009 |
| TW | 200947756 | 11/2009 |
| TW | 201005986 | 2/2010 |
| TW | 201413951 | 4/2014 |
| WO | 0248434 A2 | 6/2002 |
| WO | 2007105882 A1 | 9/2007 |

OTHER PUBLICATIONS

"Office Action of China Related Application No. 2014102402574.4", dated Dec. 9, 2016, p. 1-p. 8.

"Office Action of China Related Application No. 2014102402574.4", dated Jul. 20, 2017, p. 1-p. 5.

"Office Action of China Related Application No. 201510224693.7", dated Jun. 5, 2018, p. 1-p. 45.

"Notice of Allowance of Taiwan Related Application No. 104114223", dated Jul. 28, 2016, p. 1-p. 3.

Office Action of Taiwan Related Application No. 101145835 dated Nov. 19, 2014, p. 1-p. 6.

"Office Action of Taiwan Related Application No. 102129696" dated Jul. 8, 2015, p. 1-p. 6.

Office Action of Taiwan Related Application No. 103122543 dated Mar. 24, 2016, p. 1-p. 6.

Office Action of US Related U.S. Appl. No. 13/917,645 dated Jan. 19, 2015, p. 1-p. 14.

Office Action of US Related U.S. Appl. No. 13/917,645 dated Aug. 13, 2015, p. 1-p. 12.

Office Action of US Related U.S. Appl. No. 14/940,173 dated Apr. 8, 2016, p. 1-p. 17.

Office Action of US Related U.S. Appl. No. 14/940,173 dated Oct. 18, 2016, p. 1-p. 21.

Notice of allowance of US Related U.S. Appl. No. 14/940,173 dated Aug. 30, 2017, p. 1-p. 20.

Office Action of US Related U.S. Appl. No. 14/940,175 dated Jun. 28, 2016, p. 1-p. 20.

Office Action of US Related U.S. Appl. No. 14/940,175 dated Mar. 23, 2017, p. 1-p. 18.

Office Action of US Related U.S. Appl. No. 14/707,010 dated Feb. 1, 2016, p. 1-p. 13.

Office Action of US Related U.S. Appl. No. 14/459,335 dated Feb. 18, 2015, p. 1-p. 17.

Office Action of US Related U.S. Appl. No. 14/459,335 dated Aug. 20, 2015, p. 1-p. 33.

Office Action of US Related U.S. Appl. No. 14/459,335 dated Feb. 19, 2016, p. 1-p. 43.

Office Action of US Related U.S. Appl. No. 14/459,335 dated Jul. 5, 2016, p. 1-p. 43.

* cited by examiner

NITROGEN-CONTAINING SEMICONDUCTOR DEVICE

CROSS-REFERENCE TO RELATED APPLICATION

This application claims the priority benefit of Taiwan application serial no. 105130176, filed on Sep. 19, 2016. The entirety of the above-mentioned patent application is hereby incorporated by reference herein and made a part of this specification.

BACKGROUND OF THE INVENTION

1. Field of the Invention

The invention relates to a semiconductor device, and particularly relates to a nitrogen-containing semiconductor device.

2. Description of Related Art

In a conventional semiconductor device, in order to facilitate the chance of combination of electrons and holes and further stop electrons, a nitrogen-containing quaternary $Al_xIn_yGa_{1-x-y}N$ semiconductor layer is disposed between an active layer and a P-type semiconductor layer. However, due to the difference in lattice structure in a semiconductor layer including a GaN or AlGaN material and a substrate, the epitaxial quality of the semiconductor layer may be affected. Thus, how to effectively obtain a nitrogen-containing semiconductor layer with a preferable epitaxial quality remains an issue to work on.

SUMMARY OF THE INVENTION

The invention provides a nitrogen-containing semiconductor device with preferable epitaxial quality.

A nitrogen-containing semiconductor device according to an embodiment includes a substrate, a first AlGaN buffer layer, a second AlGaN buffer layer, and a semiconductor stacking layer. The first AlGaN buffer layer is disposed on the substrate. In addition, a chemical formula of the first AlGaN buffer layer is $Al_xGa_{1-x}N$, wherein $0 \le x \le 1$. The first AlGaN buffer layer is doped with at least one of oxygen having a concentration greater than $5\times10^{17}$ cm$^{-3}$ and carbon having a concentration greater than $5\times10^{17}$ cm$^{-3}$. The second AlGaN buffer layer is disposed on the first AlGaN buffer layer, and a chemical formula of the second AlGaN buffer layer is $Al_yGa_{1-y}N$, wherein $0 \le y \le 1$. The semiconductor stacking layer is disposed on the second AlGaN buffer layer.

According to an embodiment of the invention, a material of the substrate includes sapphire, silicon or silicon carbide (SiC).

According to an embodiment of the invention, when the material of the substrate includes sapphire, a surface of the substrate connected to the first AlGaN buffer layer is a patterned surface. When the material of the substrate includes silicon or SiC, the surface of the substrate connected to the first AlGaN buffer layer is a smooth surface.

According to an embodiment of the invention, a thickness of the first AlGaN buffer layer is in a range from 1 nanometer to 100 nanometers.

According to an embodiment of the invention, x in the chemical formula of the first AlGaN buffer layer is greater than y in the chemical formula of the second AlGaN buffer layer.

According to an embodiment of the invention, the nitrogen-containing semiconductor device further includes a third AlGaN buffer layer. A chemical formula of the third AlGaN buffer layer is $Al_zGa_{1-z}N$, wherein $0 \le z \le 1$. The third AlGaN buffer layer is disposed between the first AlGaN buffer layer and the second AlGaN buffer layer, and a concentration of Al in the first AlGaN buffer layer is greater than a concentration of Al in the third AlGaN buffer layer.

According to an embodiment of the invention, a thickness of the third AlGaN buffer layer is in a range from 1 nanometer to 100 nanometers.

A nitrogen-containing semiconductor device according to an embodiment includes a substrate, a first AlGaN buffer layer, a GaN buffer layer, a second AlGaN buffer layer, and a semiconductor stacking layer. The first AlGaN buffer layer is disposed on the substrate. In addition, a chemical formula of the first AlGaN buffer layer is $Al_xGa_{1-x}N$, wherein $0 \le x \le 1$. The first AlGaN buffer layer is doped with at least one of oxygen having a concentration greater than $5\times10^{17}$ cm$^{-3}$ and carbon having a concentration greater than $5\times10^{17}$ cm$^{-3}$. The GaN buffer layer is disposed on the first AlGaN buffer layer. The second AlGaN buffer layer is disposed on the GaN buffer layer, and a chemical formula of the second AlGaN buffer layer is $Al_yGa_{1-y}N$, wherein $0 \le y \le 1$. The semiconductor stacking layer is disposed on the second AlGaN buffer layer.

According to an embodiment of the invention, when a material of the substrate includes sapphire, silicon carbide (SiC) or silicon, a surface of the substrate connected to the first AlGaN buffer layer is a smooth surface.

According to an embodiment of the invention, a thickness of the first AlGaN buffer layer is in a range from 1 nanometer to 100 nanometers.

According to an embodiment of the invention, a thickness of the GaN buffer layer is in a range from 100 nanometers to 10 micrometers.

According to an embodiment of the invention, a thickness of the second AlGaN buffer layer is in a range from 0.5 nanometers to 20 nanometers.

According to an embodiment of the invention, the nitrogen-containing semiconductor device further includes a third AlGaN buffer layer. A chemical formula of the third AlGaN buffer layer is $Al_zGa_{1-z}N$, wherein $0 \le z \le 1$. The third AlGaN buffer layer is disposed between the first AlGaN buffer layer and the GaN buffer layer, and a concentration of Al in the first AlGaN buffer layer is greater than a concentration of Al in the third AlGaN buffer layer.

According to an embodiment of the invention, a thickness of the third AlGaN buffer layer is in a range from 10 nanometers to 5 micrometers.

According to an embodiment of the invention, Al is distributed in a uniform concentration in the third AlGaN buffer layer.

According to an embodiment of the invention, a concentration of Al in the third AlGaN buffer layer decreases from a side connected to the first AlGaN buffer layer to a side connected to the GaN buffer layer.

According to an embodiment of the invention, a thickness of the GaN buffer layer connected to the third AlGaN buffer layer is in a range from 10 nanometers to 5 micrometers.

Based on the above, the nitrogen-containing semiconductor device according to the embodiments of the invention includes the AlGaN buffer layer capable of providing a desirable lattice structure and is thus able to facilitate an overall epitaxial quality.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
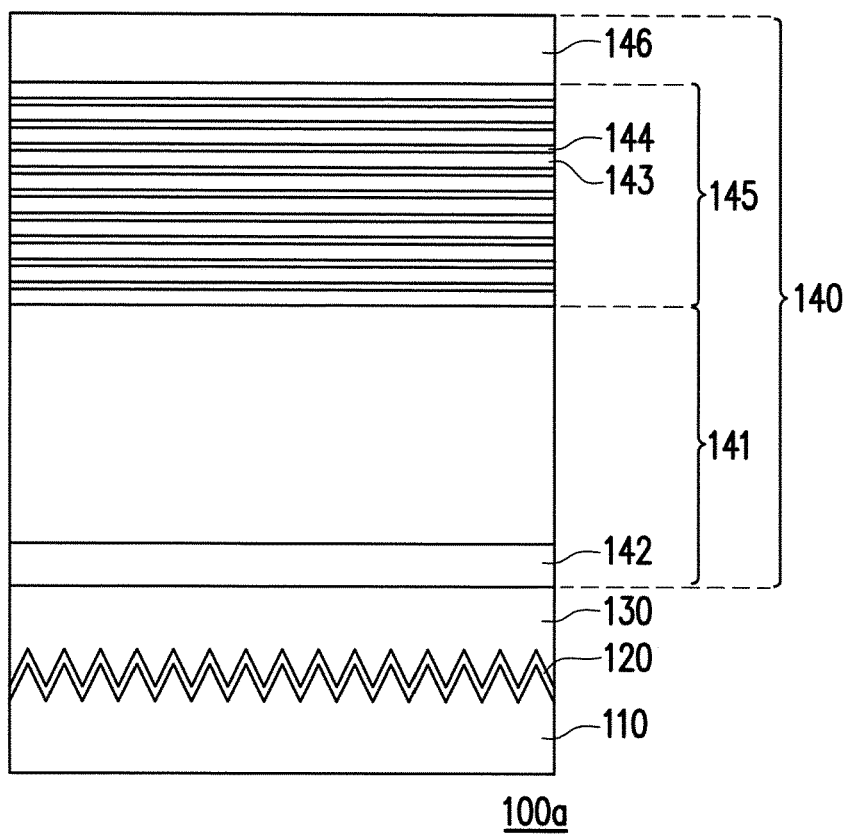
FIG. 1 is a schematic cross-sectional view illustrating a nitrogen-containing semiconductor device according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view illustrating a nitrogen-containing semiconductor device according to a first embodiment of the invention. Referring to FIG. 1, a nitrogen-containing semiconductor device 100a of the embodiment includes a substrate 110, a first AlGaN buffer layer 120, a second AlGaN buffer layer 130, and a semiconductor stacking layer 140. The first AlGaN buffer layer 120 is disposed on the substrate 110, and a chemical formula of the first AlGaN buffer layer 120 is $Al_xGa_{1-x}N$, wherein $0 \leq x \leq 1$. In particular, the first AlGaN buffer layer 120 of the embodiment is doped with at least one of oxygen having a concentration greater than $5 \times 10^{17}$ cm$^{-3}$ and carbon having a concentration greater than $5 \times 10^{17}$ cm$^{-3}$. The second AlGaN buffer layer 130 is disposed on the first AlGaN buffer layer 120, and a chemical formula of the second AlGaN buffer layer 130 is $Al_yGa_{1-y}N$, wherein $0 \leq y \leq 1$. The semiconductor stacking layer 140 is disposed on the second AlGaN buffer layer 130.

Specifically, referring to FIG. 1, the substrate 110 of the embodiment is connected to the semiconductor stacking layer 140 sequentially through the first AlGaN buffer layer 120 and the second AlGaN buffer layer 130. In other words, in the nitrogen-containing semiconductor device 100a of the embodiment, the first AlGaN buffer layer 120 is disposed between the substrate 110 and the second AlGaN buffer layer 130, and the second AlGaN buffer layer 130 is disposed between the first AlGaN buffer layer 120 and the semiconductor stacking layer 140. A thickness of the first AlGaN buffer layer 120 is in a range from 1 nanometer to 100 nanometers and consequently provides a preferable stress and structure buffering effect. The second AlGaN buffer layer 130 is grown in under a temperature condition greater than 800° C., for example. However, the invention is not limited thereto. In addition, x in the chemical formula of the first AlGaN buffer layer 120 is greater than y in the chemical formula of the second AlGaN buffer layer 130. Accordingly, during epitaxial growth, a content of Al may gradually decrease in a bottom-up manner to avoid a strong interface stress resulting from a sudden change of lattice structure.

Moreover, in the embodiment, the first AlGaN buffer layer 120 is described with an example doped with oxygen having a concentration greater than $5 \times 10^{17}$ cm$^{-3}$. In addition, oxygen atoms may take positions of some of nitrogen atoms in the first AlGaN buffer layer 120 to change a lattice constant of the first AlGaN buffer layer 120. In addition, the first AlGaN buffer layer 120 connecting the substrate 110 and the second AlGaN buffer layer 130 may alleviate an interface stress. Besides, the second AlGaN buffer layer 130 of the embodiment is grown under a high temperature condition, for example. Moreover, with the lattice constant of the material of the first AlGaN buffer layer 120, the desirable semiconductor stacking layer 140 may be formed on the second AlGaN buffer layer 130.

In other words, the first AlGaN buffer layer 120 of the embodiment is doped with a dopant (e.g., oxygen) that may replace nitrogen atoms. Therefore, the first AlGaN buffer layer 120 may serve as a buffer for the interface stress between the substrate 110 and the second AlGaN buffer layer 130. Nevertheless, the dopant of the first AlGaN buffer layer 120 of the embodiments of the invention is not limited to oxygen. In other embodiments, the first AlGaN buffer layer may also be doped with carbon having a concentration greater than $5 \times 10^{17}$ cm$^{-3}$ or doped with two elements such as carbon having a concentration greater than $5 \times 10^{17}$ cm$^{-3}$ and oxygen having a concentration greater than $5 \times 10^{17}$ cm$^{-3}$. It should be understood that the invention does not intend to impose a limitation on this regard.

Referring to FIG. 1, the semiconductor stacking layer 140 in the first embodiment of the invention includes a first type doped semiconductor layer 141, a multiple quantum well layer 145, and a second type doped semiconductor layer 146. In addition, the multiple quantum well layer 145 includes a plurality of barrier layers 143 and a plurality of well layers 145. For example, the first type doped semiconductor layer 141 includes a GaN layer 142. Accordingly, the first AlGaN buffer layer 120 and the second AlGaN buffer layer 130 may alleviate a stress between the GaN layer 142 and the substrate 110.

More specifically, a material of the substrate 110 of the embodiment of the invention includes sapphire, for example, so the first AlGaN buffer layer 120 and the second AlGaN buffer layer 130 may provide a preferable buffering effect between the substrate 110 and the GaN layer 142. Nevertheless, the invention is not limited thereto. In other embodiments of the invention, the material of the substrate 110 may include silicon or silicon carbide (SiC).

The nitrogen-containing semiconductor device 100a of the embodiment is a light emitting diode (LED), for example. Therefore, when the material of the substrate 110 includes sapphire, a surface of the substrate 110 connected to the first AlGaN buffer layer 120 may be a patterned surface, so as to facilitate a light emitting effect. In other embodiments of the invention, when the material of the substrate 110 includes carbon or SiC, the surface of the substrate 110 connected to the first AlGaN buffer layer 120 may be a smooth surface. In other words, the material and the surface structure of the substrate 110 of the nitrogen-containing semiconductor device 100a according to the embodiment of the invention are not limited to those of the substrate 110 described above. Other suitable materials and surface features may also be chosen in other embodiments.

It should be noted that the reference numerals and a part of the contents in the previous embodiment are used in the following embodiments, in which identical reference numerals indicate identical or similar components, and descriptions of the same technical contents may be referred to the preceding embodiment and shall not be repeated in the following.

Figure 2:
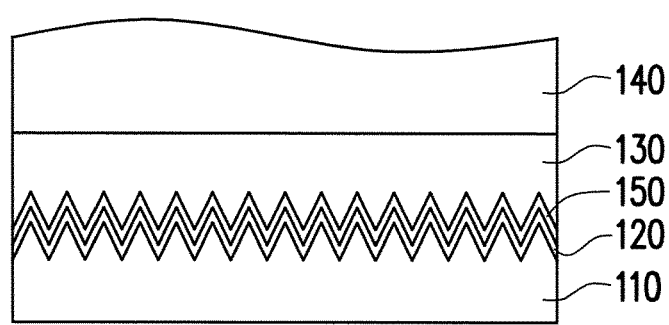
FIG. 2 is a schematic partial cross-sectional view illustrating a nitrogen-containing semiconductor device according to a second embodiment of the invention.

FIG. 2 is a schematic partial cross-sectional view illustrating a nitrogen-containing semiconductor device according to a second embodiment of the invention. Referring to FIG. 2, in the second embodiment of the invention, a nitrogen-containing semiconductor device 100b is similar to the nitrogen-containing semiconductor device 100a of FIG. 1, except for a main difference that the nitrogen-containing semiconductor device 100b further includes a third AlGaN buffer layer 150, and a chemical formula of the third AlGaN buffer layer 150 is $Al_zGa_{1-z}N$, wherein $0 \leq z \leq 1$. The third AlGaN buffer layer 150 is disposed between the first AlGaN buffer layer 120 and the second AlGaN buffer layer 130. In addition, a concentration of Al in the first AlGaN buffer layer 120 is greater than a concentration of Al in the third AlGaN buffer layer 150. Therefore, the third AlGaN buffer layer 150 may further alleviate the interface stress between the first AlGaN buffer layer 120 and the second AlGaN buffer layer 130, so as to form the desirable semiconductor stacking layer 140. In other words, the first AlGaN buffer layer 120 and the third AlGaN buffer layer 150 form a dual-layered buffer structure between the second AlGaN buffer layer 130 and the substrate 110, so that the lattice constant does not affect an epitaxial quality of the semiconductor stacking layer 140.

Herein, a thickness of the third AlGaN buffer layer 150 of the embodiment is in a range from 1 nanometer to 100 nanometers. However, the invention is not limited thereto. In addition, the first AlGaN buffer layer 120 of the embodiment is formed by performing a physical vapor deposition (PVD) process, for example, and the second AlGaN buffer layer 130 and the third AlGaN buffer layer 150 are formed by performing a metal-organic chemical vapor deposition (MOCVD) process, for example. However, the invention is not limited thereto.

Figure 3:
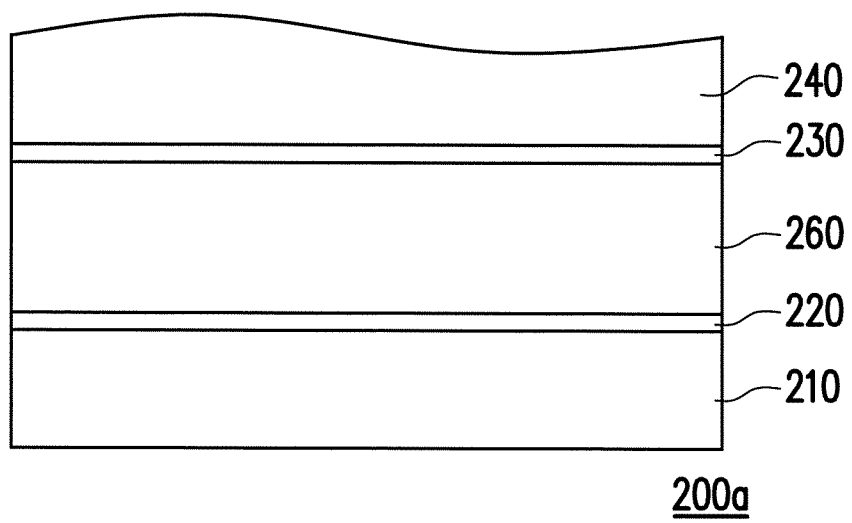
FIG. 3 is a schematic partial cross-sectional view illustrating a nitrogen-containing semiconductor device according to a third embodiment of the invention.

FIG. 3 is a schematic partial cross-sectional view illustrating a nitrogen-containing semiconductor device according to a third embodiment of the invention. Referring to FIG. 3, a nitrogen-containing semiconductor device 200a of the embodiment includes a substrate 210, a first AlGaN buffer layer 220, a GaN buffer layer 260, a second AlGaN buffer layer 230, and a semiconductor stacking layer 240. The first AlGaN buffer layer 220 is disposed on the substrate 210, and a chemical formula of the first AlGaN buffer layer 220 is $Al_xGa_{1-x}N$, wherein $0 \leq x \leq 1$. In particular, the first AlGaN buffer layer 220 is doped with at least one of oxygen having a concentration greater than $5 \times 10^{17}$ cm$^{-3}$ and carbon having a concentration greater than $5 \times 10^{17}$ cm$^{-3}$. The GaN buffer layer 260 is disposed on the first AlGaN buffer layer 220. The second AlGaN buffer layer 230 is disposed on the GaN buffer layer 260, and a chemical formula of the second AlGaN buffer layer 230 is $Al_yGa_{1-y}N$, wherein $0 \leq y \leq 1$. The semiconductor stacking layer 240 is disposed on the second AlGaN buffer layer 230.

In the embodiment, the first AlGaN buffer layer 220 is described with an example doped with carbon having a concentration greater than $5 \times 10^{17}$ cm$^{-3}$. Since the first AlGaN buffer layer 220 is doped with carbon, the first AlGaN buffer layer 220 is able to provide a desirable buffer to alleviate an interface stress between the substrate 210 and the GaN buffer layer 260. More specifically, the doped concentration of carbon in the first AlGaN buffer layer 220 is greater than $5 \times 10^{17}$ cm$^{-3}$. In other embodiments of the invention, the first AlGaN buffer layer 220 may also be doped with oxygen having a concentration greater than $5 \times 10^{17}$ cm$^{-3}$ or doped with oxygen having a doped concentration greater than $5 \times 10^{17}$ cm$^{-3}$ and carbon having a doped concentration greater than $5 \times 10^{17}$ cm$^{-3}$. It should be understood that the invention does not intend to impose a limitation on this regard. Moreover, since the nitrogen-containing semiconductor device 200a of the embodiment includes the GaN buffer layer 260, the nitrogen-containing semiconductor device 200a is applicable in a power device and provides a power semiconductor device having a preferable epitaxial quality.

A material of the substrate 210 includes sapphire, for example, and a surface of the substrate 210 connected to the first AlGaN buffer layer 220 is a smooth surface. However, the invention is not limited thereto. In other embodiments of the invention, the material of the substrate 210 may include silicon or silicon carbide (SiC). Moreover, a thickness of the first AlGaN buffer layer 220 is in a range from 1 nanometer to 100 nanometers, a thickness of the GaN buffer layer 260 is in a range from 100 nanometers to 10 micrometers, and a thickness of the second AlGaN buffer layer 230 is in a range from 0.5 nanometers to 20 nanometers. However, the invention is not limited thereto.

Figure 4:
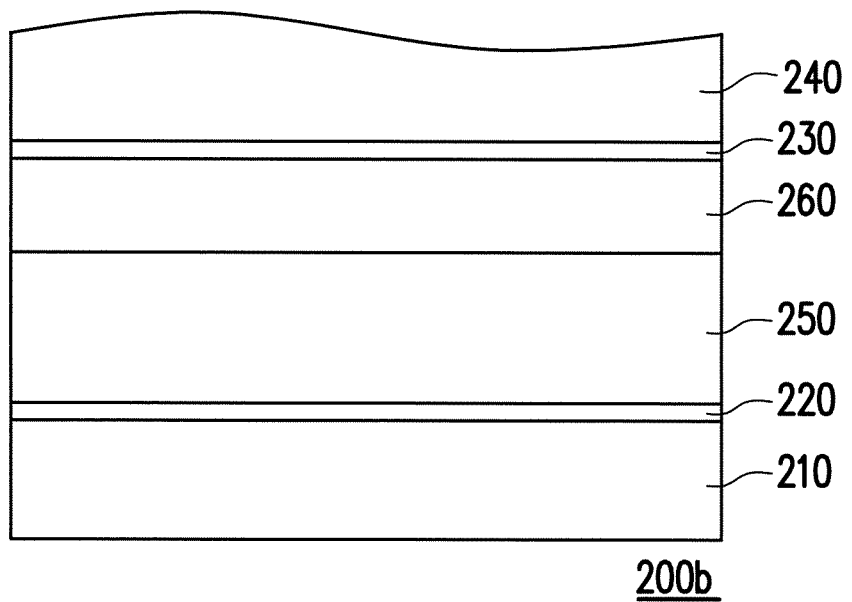
FIG. 4 is a schematic partial cross-sectional view illustrating a nitrogen-containing semiconductor device according to a fourth embodiment of the invention.

FIG. 4 is a schematic partial cross-sectional view illustrating a nitrogen-containing semiconductor device according to a fourth embodiment of the invention. Referring to FIG. 4, in the fourth embodiment of the invention, a nitrogen-containing semiconductor device 200b is similar to the nitrogen-containing semiconductor device 200a of FIG. 3, except for a main difference that the nitrogen-containing semiconductor device 200b in the fourth embodiment of the invention further includes a third AlGaN buffer layer 250, and a chemical formula of the third AlGaN buffer layer 250 is $Al_zGa_{1-z}N$, wherein $0 \leq z \leq 1$. The third AlGaN buffer layer 250 is disposed between the first AlGaN buffer layer 220 and the GaN buffer layer 260. In addition, a concentration of Al in the first AlGaN buffer layer 220 is greater than a concentration of Al in the third AlGaN buffer layer 250. Therefore, the third AlGaN buffer layer 250 may further alleviate an overall interface stress to form the desirable semiconductor stacking layer 240 on the second AlGaN buffer layer 230.

A thickness of the third AlGaN buffer layer 250 is in a range from 10 nanometers to 5 micrometers, and Al is distributed in a uniform concentration in the third AlGaN buffer layer 250. However, the invention is not limited thereto. In other embodiments of the invention, a concentration of Al in the third AlGaN buffer layer 250 may also decrease from a side connected to the first AlGaN buffer layer 220 to a side connected to the GaN buffer layer 260.

In view of the foregoing, since the nitrogen-containing semiconductor device according to the embodiments of the invention includes the first AlGaN buffer layer and the second AlGaN buffer layer, and the first AlGaN buffer layer is doped with oxygen or carbon having a concentration greater than $5 \times 10^{17}$ cm$^{-3}$, the interface stress between the substrate and the semiconductor stacking layer may be alleviated, so as to facilitate the overall epitaxial quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitrogen-containing semiconductor device, comprising:
   a substrate;
   a first AlGaN buffer layer, disposed on the substrate, wherein a chemical formula of the first AlGaN buffer layer is $Al_xGa_{1-x}N$, wherein $0 \le x \le 1$, and the first AlGaN buffer layer is doped with at least one of oxygen having a concentration greater than $5 \times 10^{17}$ cm$^{-3}$ and carbon having a concentration greater than $5 \times 10^{17}$ cm$^{-3}$;
   a GaN buffer layer, disposed on the first AlGaN buffer layer;
   a second AlGaN buffer layer, disposed on the GaN buffer layer, wherein a chemical formula of the second AlGaN buffer layer is $Al_yGa_{1-y}N$, wherein $0 \le y \le 1$;
   a third AlGaN buffer layer, wherein a chemical formula of the third AlGaN buffer layer is $Al_zGa_{1-z}N$, wherein $0 \le z \le 1$, the third AlGaN buffer layer is disposed between the first AlGaN buffer layer and the GaN buffer layer, and a concentration of Al in the first AlGaN buffer layer is greater than a concentration of Al in the third AlGaN buffer layer; and
   a semiconductor stacking layer, disposed on the second AlGaN buffer layer,
   wherein a concentration of Al in the third AlGaN buffer layer decreases from a side connected to the first AlGaN buffer layer to a side connected to the GaN buffer layer.

2. The nitrogen-containing semiconductor device as claimed in claim 1, wherein when the material of the substrate comprises sapphire, a surface of the substrate connected to the first AlGaN buffer layer is a patterned surface, and when the material of the substrate comprises silicon or SiC, the surface of the substrate connected to the first AlGaN buffer layer is a smooth surface.

3. The nitrogen-containing semiconductor device as claimed in claim 1, wherein x in the chemical formula of the first AlGaN buffer layer is greater than y in the chemical formula of the second AlGaN buffer layer.

4. A nitrogen-containing semiconductor device, comprising:
   a substrate;
   a first AlGaN buffer layer, disposed on the substrate, wherein a chemical formula of the first AlGaN buffer layer is $Al_xGa_{1-x}N$, wherein $0 \le x \le 1$;
   a GaN buffer layer, disposed on the first AlGaN buffer layer;
   a second AlGaN buffer layer, disposed on the GaN buffer layer, wherein a chemical formula of the second AlGaN buffer layer is $Al_yGa_{1-y}N$, wherein $0 \le y \le 1$, and the first AlGaN buffer layer is doped with at least one of oxygen having a concentration greater than $5 \times 10^{17}$ cm$^{-3}$ and carbon having a concentration greater than $5 \times 10^{17}$ cm$^{-3}$;
   a third AlGaN buffer layer, wherein a chemical formula of the third AlGaN buffer layer is $Al_zGa_{1-z}N$, wherein $0 \le z \le 1$, the third AlGaN buffer layer is disposed between the first AlGaN buffer layer and the GaN buffer layer, and a concentration of Al in the first AlGaN buffer layer is greater than a concentration of Al in the third AlGaN buffer layer; and
   a semiconductor stacking layer, disposed on the second AlGaN buffer layer,
   wherein a concentration of Al in the third AlGaN buffer layer decreases from a side connected to the first AlGaN buffer layer to a side connected to the GaN buffer layer.

5. The nitrogen-containing semiconductor device as claimed in claim 4, wherein when a material of the substrate comprises sapphire, a surface of the substrate connected to the first AlGaN buffer layer is a patterned surface, and when the material of the substrate comprises silicon carbide (SiC) or silicon, a surface of the substrate connected to the first AlGaN buffer layer is a smooth surface.

6. The nitrogen-containing semiconductor device as claimed in claim 4, wherein a thickness of the first AlGaN buffer layer is in a range from 1 nanometer to 100 nanometers, a thickness of the GaN buffer layer is in a range from 100 nanometers to 10 micrometers, a thickness of the second AlGaN buffer layer is in a range from 0.5 nanometers to 20 nanometers.

7. The nitrogen-containing semiconductor device as claimed in claim 1, wherein a material of the substrate comprises sapphire, silicon carbide (SiC) or silicon.

8. The nitrogen-containing semiconductor device as claimed in claim 1, wherein a thickness of the first AlGaN buffer layer is in a range from 1 nanometer to 100 nanometers, a thickness of the GaN buffer layer is in a range from 100 nanometers to 10 micrometers, a thickness of the second AlGaN buffer layer is in a range from 0.5 nanometers to 20 nanometers.

9. The nitrogen-containing semiconductor device as claimed in claim 4, wherein a material of the substrate comprises sapphire, silicon carbide (SiC) or silicon.

10. The nitrogen-containing semiconductor device as claimed in claim 4, wherein x in the chemical formula of the first AlGaN buffer layer is greater than y in the chemical formula of the second AlGaN buffer layer.

* * * * *